(12) United States Patent
Li

(10) Patent No.: US 10,574,927 B1
(45) Date of Patent: Feb. 25, 2020

(54) IMAGE SENSOR HAVING ANALOG-TO-DIGITAL CONVERTER SELECTIVELY ENABLING STORAGE OF COUNT VALUE, AND ANALOG-TO-DIGITAL CONVERSION METHOD

(71) Applicant: SHENZHEN GOODIX TECHNOLOGY CO., LTD., Guangdong (CN)

(72) Inventor: Hsin-Lun Li, Taipei (TW)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/283,487

(22) Filed: Feb. 22, 2019

Related U.S. Application Data

(60) Provisional application No. 62/754,864, filed on Nov. 2, 2018.

(51) Int. Cl.
*H03M 1/12* (2006.01)
*H04N 5/378* (2011.01)
(Continued)

(52) U.S. Cl.
CPC .......... *H04N 5/378* (2013.01); *H03M 1/0624* (2013.01); *H03M 1/123* (2013.01); *H03M 1/20* (2013.01); *H03M 1/56* (2013.01); *H01L 27/14609* (2013.01); *H01L 27/14641* (2013.01); *H03M 1/00* (2013.01); *H03M 1/12* (2013.01); *H04N 3/1575* (2013.01)

(58) Field of Classification Search
CPC ..... H03M 1/12; H03M 1/00; H01L 27/14609; H01L 27/14641; H04N 3/1575

USPC ........ 341/155, 169, 170, 164; 348/308, 303, 348/300
See application file for complete search history.

(56) References Cited

U.S. PATENT DOCUMENTS 8,421,891 B2  4/2013  Morikawa et al.
2004/0183932 A1  9/2004  Kasuga
(Continued)

OTHER PUBLICATIONS

Toyama, Takayuki, et al. A 17.7 Mpixel 120fps CMOS image sensor with 34.8 Gb/s readout. In: Solid-State Circuits Conference Digest of Technical Papers (ISSCC), 2011 IEEE International IEEE, 2011. p. 420-422.

*Primary Examiner* — Joseph J Lauture
(74) *Attorney, Agent, or Firm* — WPAT, P.C., Intellectual Property Attorneys; Anthony King

(57) ABSTRACT

An analog-to-digital converter is provided. The analog-to-digital converter is configured to convert an analog signal to a digital signal. The analog-to-digital converter includes a comparison circuit and a processing circuit. The comparison circuit is configured to compare the analog signal with each of a ramp signal and the ramp signal plus a predetermined offset to generate a control signal. The processing circuit, coupled to the comparison circuit, is configured to selectively store a count value of a counter circuit as the digital signal according to the control signal. When the control signal indicates that a signal level of the analog signal is greater than a signal level of the ramp signal and less than the signal level of the ramp signal plus the predetermined offset, the processing circuit is configured to store the count value as the digital signal.

20 Claims, 7 Drawing Sheets

(51) Int. Cl.
*H03M 1/06* (2006.01)
*H03M 1/56* (2006.01)
*H03M 1/20* (2006.01)
H01L 27/146 (2006.01)
H03M 1/00 (2006.01)
H04N 3/14 (2006.01)

(56) References Cited

U.S. PATENT DOCUMENTS

| | | |
|---|---|---|
| 2009/0195431 A1 | 8/2009 | Snoeij et al. |
| 2011/0043676 A1* | 2/2011 | Lim ........................ H04N 5/378 348/308 |
| 2013/0087688 A1 | 4/2013 | Nishi |
| 2013/0093934 A1 | 4/2013 | Nishi |
| 2015/0138413 A1 | 5/2015 | Sato |

* cited by examiner

IMAGE SENSOR HAVING ANALOG-TO-DIGITAL CONVERTER SELECTIVELY ENABLING STORAGE OF COUNT VALUE, AND ANALOG-TO-DIGITAL CONVERSION METHOD

CROSS-REFERENCE TO RELATED APPLICATIONS

The present application claims priority to U.S. Provisional Patent Application No. 62/754,864, filed on Nov. 2, 2018, which is incorporated by reference herein in its entirety.

BACKGROUND

The present disclosure relates to analog-to-digital conversion and, more particularly, to an analog-to-digital converter, which is capable of enabling storage of a count value provided by a counter circuit in response to a signal level of an analog signal to be converted, and a related image sensor and analog-to-digital conversion method.

Complementary metal-oxide-semiconductor image sensor (CMOS image sensor or CIS) technology is widely used in imaging devices, such as digital cameras or mobile phones using on-board cameras. To meet the demand for high resolution and high speed imaging, a CMOS image sensor usually employs a column-parallel analog-to-digital conversion architecture to sample and convert analog signals outputted from pixels. The column-parallel analog-to-digital conversion architecture includes multiple parallel analog-to-digital converter (ADC) channels, each of which is used for converting an analog signal coming from a column of pixels. With the use of the parallel ADC channels, the column-parallel analog-to-digital conversion architecture can increase a readout speed of a large pixel array since respective analog signals outputted from different columns of pixels can be processed in a parallel manner.

SUMMARY

The described embodiments provide an analog-to-digital converter, and a related image sensor and analog-to-digital conversion method.

Some embodiments described herein include an analog-to-digital converter for converting an analog signal to a digital signal. The analog-to-digital converter includes a comparison circuit and a processing circuit. The comparison circuit is configured to compare the analog signal with each of a ramp signal and the ramp signal plus a predetermined offset to generate a control signal. The processing circuit, coupled to the comparison circuit, is configured to selectively store a count value of a counter circuit as the digital signal according to the control signal. When the control signal indicates that a signal level of the analog signal is greater than a signal level of the ramp signal and less than the signal level of the ramp signal plus the predetermined offset, the processing circuit is configured to store the count value as the digital signal.

Some embodiments described herein include an image sensor. The image sensor includes a pixel array, a counter circuit and an analog-to-digital conversion circuit. The pixel array has a plurality of pixels. The counter circuit is configured to provide a count value according to a clock signal. The analog-to-digital conversion circuit is coupled to the pixel array and the counter circuit, and includes at least one analog-to-digital converter. The analog-to-digital converter is configured to convert an analog signal outputted from a pixel to a digital signal according to the count value. The analog-to-digital converter includes a comparison circuit and a processing circuit. The comparison circuit is configured to compare the analog signal with each of a ramp signal and the ramp signal plus a predetermined offset to generate a control signal. The processing circuit, coupled to the comparison circuit, is configured to selectively store the count value of the counter circuit as the digital signal according to the control signal. When the control signal indicates that a signal level of the analog signal is greater than a signal level of the ramp signal and less than the signal level of the ramp signal plus the predetermined offset, the processing circuit is configured to store the count value as the digital signal.

Some embodiments described herein include an analog-to-digital conversion method. The analog-to-digital conversion method includes: comparing an analog signal with each of a ramp signal and the ramp signal plus a predetermined offset to generate a control signal; and when the control signal indicates that a signal level of the analog signal is greater than a signal level of the ramp signal and less than the signal level of the ramp signal plus the predetermined offset, storing a count value counted by a counter circuit as a digital signal corresponding to the analog signal.

With the use of a comparison result of an analog signal level and different ramp signal levels, the proposed analog-to-digital conversion scheme can selectively enable storage of a count value provided by a counter circuit, thereby reducing power consumption resulting from data transmission between an ADC and the counter circuit. For example, power consumption of the proposed ADC can be reduced to a small fraction, such as 10%, of that of an existing pixel ADC, depending on at least one of the analog level and a predetermined offset associated with the different ramp signal levels. Also, as a time point when a ramp signal level reaches the analog signal level is predictable, the proposed analog-to-digital conversion scheme can obtain noise response which is closed to the real noise response.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
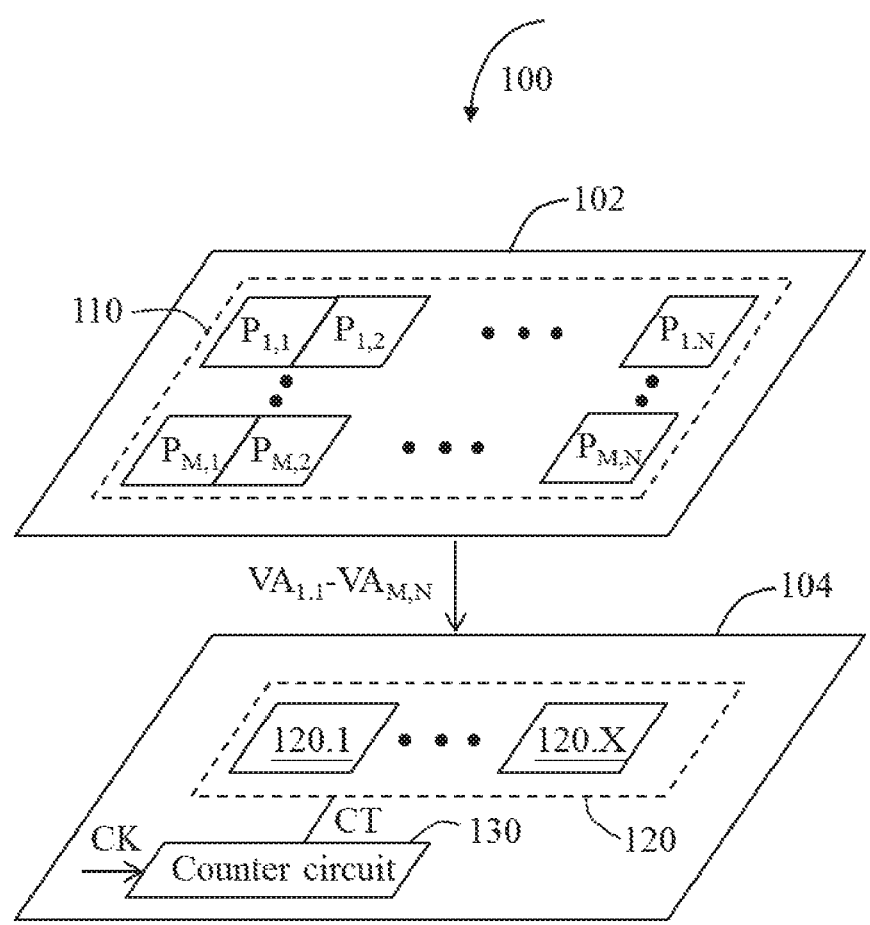
FIG. 1 is a block diagram illustrating an exemplary image sensor in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, it will be understood that when an element is referred to as being "connected to" or "coupled to" another element, it may be directly connected to or coupled to the other element, or intervening elements may be present.

Several types of ADCs have been used in the column-parallel analog-to-digital conversion architecture. Among these types of ADCs, a single slope (SS) ADC is often used in the column-parallel analog-to-digital conversion architecture since it can be implemented using a simple column circuit which occupies a small chip area and thus reduces the amount of column fixed-pattern noise (FPN). As a result, a column-parallel analog-to-digital conversion architecture may employ SS ADCs to realize an image sensor having small pixels. However, when employed in an image sensor having higher resolution, an SS ADC will limit a readout speed of such image sensor because of a low conversion speed. Also, power consumption resulting from the SS ADC increases.

Some image sensors may utilize a pixel-parallel analog-to-digital conversion architecture to realize high resolution and high speed imaging. The pixel-parallel analog-to-digital conversion architecture can convert analog signals outputted from simultaneously exposed pixels, thus reducing image distortion caused by the time shift due to the row-by-row readout in an imaging system. For example, by disposing circuit layers one above another, one of which including pixels while another including pixel ADCs for processing pixel outputs, a 3D stacked CMOS image sensor is provided to realize low noise and high resolution imaging. The 3D stacked CMOS image sensor, however, may consume large amounts of power since the number of pixel ADCs is large for high resolution applications.

The present disclosure describes exemplary analog-to-digital converters, each of which is capable of enabling storage of a count value provided by a counter circuit in response to a signal level of an analog signal to be converted. In some embodiments, the exemplary analog-to-digital converters can disable the storage of the count value until the signal level of the analog signal reaches a predetermined signal level, thus reducing power consumption resulting from the storage of the count value. The present disclosure further describes exemplary image sensors and analog-to-digital conversion methods. Similarly, with the use of the proposed analog-to-digital conversion schemes, the exemplary image sensors and analog-to-digital conversion methods can reduce power consumption resulting from data transmission between an ADC and a counter circuit. In some embodiments, the counter circuit can act as a global counter circuit shared by a plurality of ADCs. As a result, the exemplary image sensors and analog-to-digital conversion methods can simplify the circuit design of an analog-to-digital conversion architecture, such as a pixel-parallel analog-to-digital conversion architecture or a column-parallel analog-to-digital conversion architecture.

For illustrative purposes, the details of the analog-to-digital conversion scheme of the present disclosure are described below with reference to a pixel-parallel analog-to-digital conversion architecture. It is worth noting that the proposed analog-to-digital conversion scheme is not limited to pixel-parallel analog-to-digital conversion, but also is applicable of column-parallel analog-to-digital conversion and other analog-to-digital conversion applications.

FIG. 1 is a block diagram illustrating an exemplary image sensor in accordance with some embodiments of the present disclosure. In the present embodiment, the image sensor 100 can be implemented as, but is not limited to, a 3D stacked image sensor such as a 3D stacked CMOS image sensor. The image sensor 100 can include a plurality of circuit layers 102 and 104 stacked one over the other. The circuit layers 102 and 104 are electrically connected to each other through conductive structures (not shown in FIG. 1), such as conductive through via structures, bonding structures or a combination thereof.

The circuit layer 102 may include a pixel array 110 having a plurality of pixels $P_{1,1}$-$P_{M,N}$ arranged in M rows and N columns, where each of M and N is an integer greater than one. Each of the pixels $P_{1,1}$-$P_{M,N}$ is configured to capture image data in response to incident light to thereby generate an analog signal, such as a sensed voltage or a sensed current signal.

The circuit layer 104 is configured to process respective analog signals $VA_{1,1}$-$VA_{M,N}$ outputted from the pixels $P_{1,1}$-$P_{M,N}$. The circuit layer 104 includes, but is not limited to, an analog-to-digital conversion circuit 120 and a counter circuit 130. The analog-to-digital conversion circuit 120, coupled to the pixel array 110, is configured to convert the analog signals $VA_{1,1}$-$VA_{M,N}$ to corresponding digital signals. In the present embodiment, the analog-to-digital conversion circuit 120 may include one or more ADCs 120.1-120.X, where X is a positive integer. Each of the ADCs 120.1-120.X is configured to convert an analog signal outputted from a pixel to a digital signal according to the count value CT.

In some embodiments where the analog-to-digital conversion circuit 120 includes a plurality of ADCs (i.e. X is greater than one), each of the ADCs may be coupled to a plurality of pixels arranged in a predetermined direction in the pixel array 110, respectively. Also, each of the ADCs 120.1-120.X is configured to convert an analog signal of an associated pixel according to the count value CT. The predetermined direction may be a row direction or a column direction. By way of example but not limitation, X may be equal to M times N such that the ADCs 120.1-120.X disposed on the circuit layer 104 are coupled to the pixels $P_{1,1}$-$P_{M,N}$ disposed on the circuit layer 102, respectively.

Each of the ADCs 120.1-120.X can be implemented as a pixel-parallel ADC, also referred to as a pixel ADC. As a result, a portion of the ADCs 120.1-120.X are coupled to a plurality of pixels arranged in a row direction, such as a row of pixels including the pixels $P_{1,1}$-$P_{1,N}$, in the pixel array 110, respectively. Another portion of the ADCs 120.1-120.X are coupled to a plurality of pixels arranged in a column direction, such as a column of pixels including the pixels $P_{1,1}$-$P_{M,1}$, in the pixel array 110, respectively.

It is worth noting that each of the ADCs 120.1-120.X can be implemented as a column-parallel ADC, also referred to as a column ADC, without departing from the scope of the present disclosure. For example, X may be equal to N. The ADCs 120.1-120.X may be coupled to N columns of pixels in the pixel array 110, respectively. As a result, the ADCs 120.1-120.X are coupled to a plurality of pixels arranged in a column direction in the pixel array 110, respectively.

The counter circuit 130, coupled to the analog-to-digital conversion circuit 120, is configured to provide a count value CT according to a clock signal CK. By way of example but not limitation, when a readout operation of a pixel starts such that the pixel outputs an analog signal to the analog-to-digital conversion circuit 120, the counter circuit 130 can be configured to start counting a number of clock cycles of the clock signal CK to generate and update the count value CT. In the present embodiment, the counter circuit 130 can be implemented as a global counter circuit to provide the count value CT for each of the ADCs 120.1-120.X. Each of the ADCs 120.1-120.X can convert an analog signal outputted from a pixel to a digital signal according to the count value CT.

Compared to an analog-to-digital conversion circuit, which begins to store a count value once a counter circuit starts counting to provide the count value, the analog-to-digital conversion circuit 120 can greatly reduce power consumption resulting from data transmission between the analog-to-digital conversion circuit 120 and the counter circuit 130 by selectively enabling storage of the count value CT. Further description is provided below.

Figure 2:
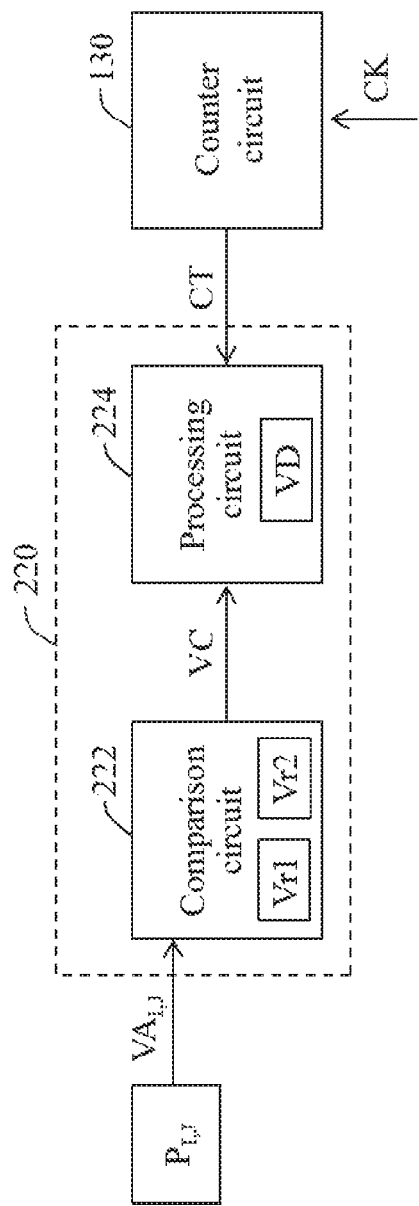
FIG. 2 illustrates an implementation of one of the analog-to-digital converters shown in FIG. 1 is illustrated in accordance with some embodiments of the present disclosure.

Referring to FIG. 2, an implementation of one of the ADCs 120.1-120.X shown in FIG. 1 is illustrated in accordance with some embodiments of the present disclosure. The ADC 220 can represent an embodiment of at least one of the ADCs 120.1-120.X shown in FIG. 1, and the pixel $P_{I,J}$ can be one of the pixels $P_{1,1}$-$P_{M,N}$ shown in FIG. 1, where I is an integer ranging from 1 to M, and J is an integer ranging from 1 to N. In the present embodiment, the ADC 220 can enable storage of the count value CT provided by the counter circuit 130 in response to a signal level of an analog signal $VA_{I,J}$ to be converted, thus reducing power consumption resulting from storage of the count value CT.

The ADC 220 includes, but is not limited to, a comparison circuit 222 and a processing circuit 224. The comparison circuit 222 is configured to compare the analog signal $VA_{I,J}$ with each of a ramp signal Vr1 and a ramp signal Vr2, which is different from the ramp signal Vr1, to thereby generate a control signal VC. For example, the control signal VC can indicate whether a signal level of the ramp signal Vr1 reaches a signal level of the analog signal $VA_{I,J}$. As another example, the control signal VC can indicate whether a signal level of the ramp signal Vr2 reaches the signal level of the analog signal $VA_{I,J}$. As still another example, the control signal VC can indicate whether the signal level of the analog signal $VA_{I,J}$ lies between the signal level of the ramp signal Vr1 and the signal level of the ramp signal Vr2.

In the present embodiment, the ramp signal Vr2 can have a signal level greater than a signal level of the ramp signal Vr1 by a predetermined offset. The signal level of the ramp signal Vr2 would exceed a signal level of the analog signal $VA_{I,J}$ before the signal level of the ramp signal Vr1 reaches the signal level of the analog signal $VA_{I,J}$. When the signal level of the ramp signal Vr2 exceeds the signal level of the analog signal $VA_{I,J}$, it implies that the signal level of the ramp signal Vr1 would soon exceed the signal level of the analog signal $VA_{I,J}$. As a result, the control signal VC can serve as an indicator to indicate whether the signal level of the ramp signal Vr1 would soon exceed the signal level of the analog signal $VA_{I,J}$.

The processing circuit 224, coupled to the comparison circuit 222, is configured to selectively store the count value CT as a digital signal VD according to the control signal VC. When the control signal VC indicates that the signal level of the analog signal $VA_{I,J}$ is greater than the signal level of the ramp signal Vr1 and less than the signal level of the ramp signal Vr2, the processing circuit 224 is configured to store the count value CT as the digital signal VD.

For example, when a readout operation of the pixel $P_{I,J}$ starts, the counter circuit 130 is configured to start counting the number of clock cycles of the clock signal CK to generate the count value CV. When the signal level of the ramp signal Vr2 is less than the signal level of the analog signal $VA_{I,J}$, the comparison circuit 222 is configured to generate the control signal VC which instructs the processing circuit 224 not to store the count value CT. When the signal level of the ramp signal Vr2 is greater than the signal level of the analog signal $VA_{I,J}$, the comparison circuit 222 is configured to generate the control signal VC which enables the processing circuit 224 to store the count value CT. As the processing circuit 224 starts to store the count value CT when the signal level of the ramp signal Vr2 exceeds the signal level of the analog signal $VA_{I,J}$, rather than when the readout operation of the pixel $P_{I,J}$ or the counting operation of the counter circuit 130 starts, power consumption resulting from data transmission between the ADC 220 and the counter circuit 130 can be greatly reduced.

In some embodiments, when the signal level of the ramp signal Vr1 is greater than the signal level of the analog signal $VA_{I,J}$, the comparison circuit 222 is configured to generate the control signal VC which instructs the processing circuit 224 to stop storing the count value CT. As a result, the processing circuit 224 may disable the storage of the count value CT when the signal level of the analog signal $VA_{I,J}$ does not lie between the signal level of the ramp signal Vr1 and the signal level of the ramp signal Vr2, further reducing power consumption in the ADC 220.

To facilitate understanding of the present disclosure, some embodiments are given below for further description of the analog-to-digital conversion scheme. This is not intended to limit the scope of the present disclosure. Other circuit implementations of the ADC 220, which selectively enables storage of a count value according to a comparison result of an analog signal level and different ramp signal levels to thereby produce a resulting digital signal, are also within the contemplated scope of the present disclosure.

Figure 3:
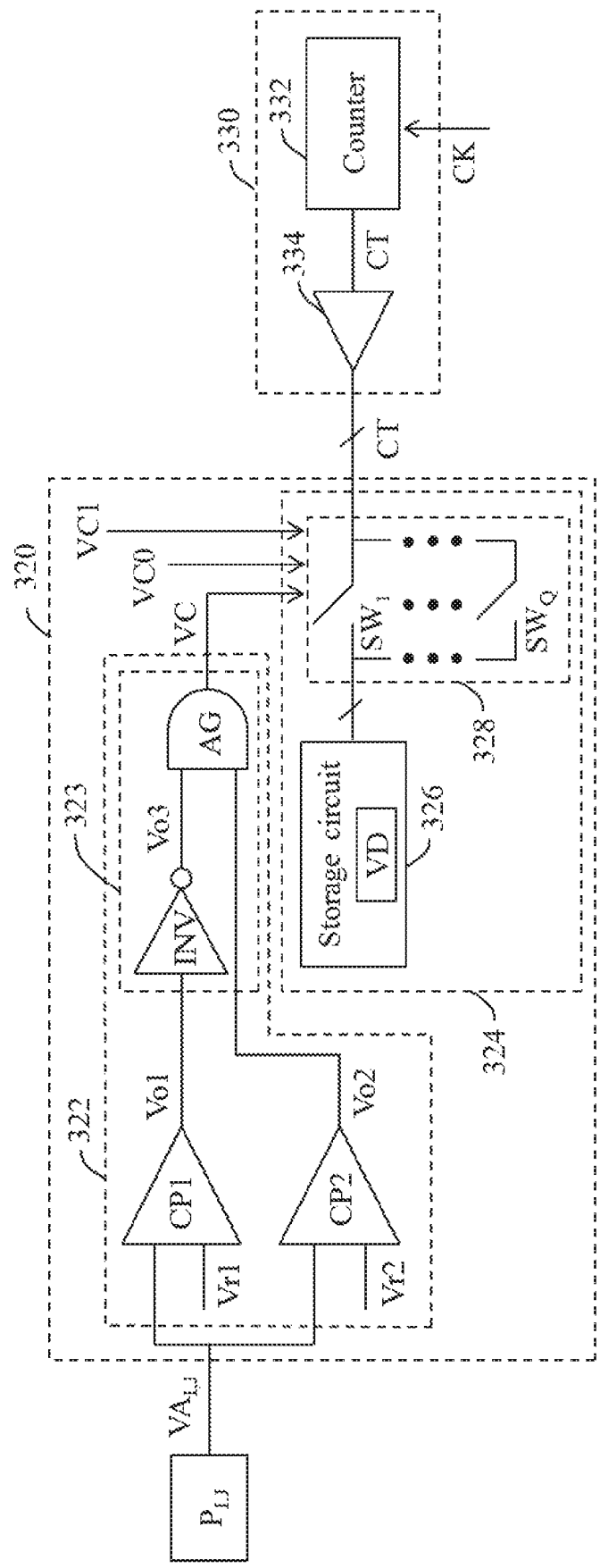
FIG. 3 illustrates an implementation of the analog-to-digital converter shown in FIG. 2 in accordance with some embodiments of the present disclosure.

FIG. 3 illustrates an implementation of the ADC 220 shown in FIG. 2 in accordance with some embodiments of the present disclosure. The ADC 320 can represent an embodiment of the ADC 220 shown in FIG. 2. In the present embodiment, the ADC 320 is configured to convert the analog signal $VA_{I,J}$ to the digital signal VD according to the count value CT provided by the counter circuit 330, which can be an embodiment of the counter circuit 130 shown in FIG. 1 and FIG. 2. The ADC 320 includes a comparison circuit 322 and a processing circuit 324. The comparison circuit 322 and the processing circuit 324 can represent embodiments of the comparison circuit 222 and the processing circuit 224 shown in FIG. 2, respectively.

The comparison circuit 322 includes, but is not limited to, a plurality of comparators CP1 and CP2, and a signal generation circuit 323. The comparator CP1 is configured to compare the analog signal $VA_{I,J}$ with the ramp signal Vr1 to generate a comparison signal Vo1. The comparator CP2 is configured to compare the analog signal $VA_{I,J}$ with the ramp signal Vr2 to generate a comparison signal Vo2. The signal generation circuit 323, coupled to the comparators CP1 and CP2, is configured to generate the control signal CV according to the comparison signals Vo1 and Vo2.

In the present embodiment, when the comparison signal Vo2 indicates that the signal level of the analog signal $VA_{I,J}$ is greater than the signal level of the ramp signal Vr2, the signal generation circuit 323 is configured to generate the control signal VC having a first signal level, thereby instructing the processing circuit 324 not to store the count value CT. When the comparison signal Vo1 indicates that the signal level of the analog signal $VA_{I,J}$ is greater than the signal level of the ramp signal Vr1, and the comparison signal Vo2 indicates that the signal level of the analog signal $VA_{I,J}$ is less than the signal level of the ramp signal Vr2, the signal generation circuit 323 is configured to generate the control signal VC having a second signal level different from the first signal level, thereby enabling the storage of the count value CT. Additionally, when the comparison signal Vo1 indicates that the signal level of the analog signal $VA_{I,J}$ is less than the signal level of the ramp signal Vr1, the signal generation circuit 323 may generate the control signal VC having the second signal level to stop the storage of the count value CT.

By way of example but not limitation, the signal generation circuit 323 may include an inverter INV and an AND gate AG. The inverter INV, coupled to the comparator CP1, is configured to invert the comparison signal Vo1 to generate a comparison signal Vo3. The AND gate AG, coupled to the comparator CP2 and the inverter INV, is configured to receive the comparison signal Vo2 and the comparison signal Vo3 to generate the control signal VC.

The processing circuit 324 includes, but not limited to, a storage circuit 326 and a switch circuit 328. The storage circuit 326 is configured to store the count value CT as the digital signal VD. The storage circuit 326 can be implemented by as a latch circuit or other types of storage circuits. The switch circuit 328 is configured to provide the count value CT of the counter circuit 330 to the storage circuit 326 according to the control signal VC. For example, the switch circuit 328 is selectively coupled between the storage circuit 326 and the counter circuit 330 according to the control signal VC. When coupled between the storage circuit 326 and the counter circuit 330 according to the control signal VC, the switch circuit 328 is configured to provide the count value CT to the storage circuit 326.

In the present embodiment, the count value CT may have Q bits, where Q is an integer greater than one. The switch circuit 328 may be implemented using Q switches $SW_1$-$SW_Q$, each of which is controlled by the control signal VC to selectively transmit one bit of the count value CT from the counter circuit 330 to the storage circuit 326.

The counter circuit 330 may include a counter 332 and a buffer circuit 334. The counter 332 can be a global counter shared by a plurality of ADCs, such as a global grey coded counter or other types of global counters. The counter 332 is configured to generate the count value CT of Q bits according to the clock signal CK. The buffer circuit 334 is configured to buffer and transmit the count value CT, thereby reducing loading of the ADC 320. Please note that, in some embodiments, the buffer circuit 334 may be optional.

Figure 4:
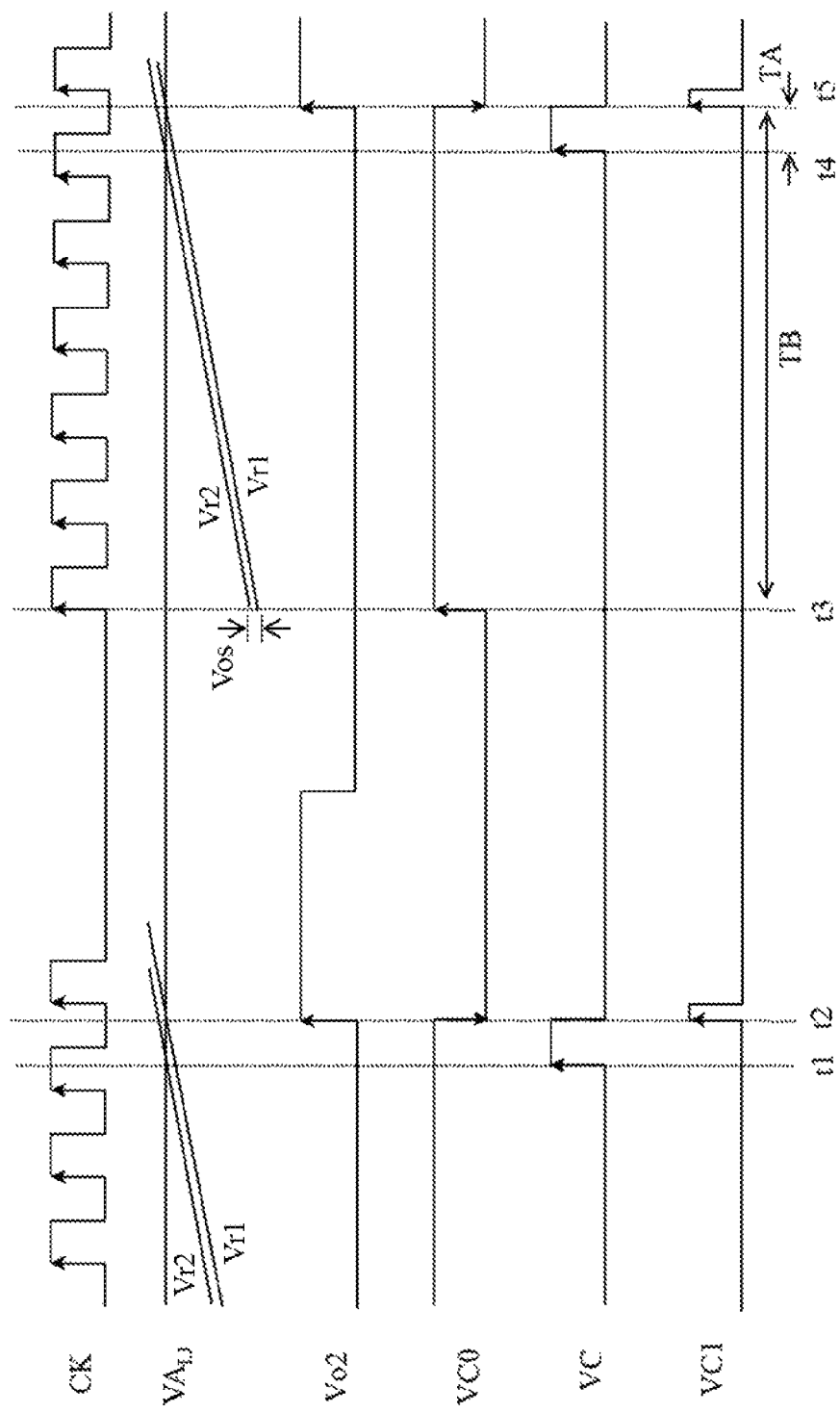
FIG. 4 illustrates a signal waveform associated with the operation of the analog-to-digital converter shown in FIG. 3 in accordance with some embodiments of the present disclosure.

FIG. 4 illustrates a signal waveform associated with the operation of the ADC 320 shown in FIG. 3 in accordance with some embodiments of the present disclosure. Referring to FIG. 4 and also to FIG. 3, the signal level of the ramp signal Vr2 can be greater than the signal level of the ramp signal Vr1 by a predetermined offset Vos. Before time t1, the analog signal $VA_{I,J}$ is read out from the pixel $P_{I,J}$, and the counter 332 is activated to provide and update the count value CT according to the clock signal CK. As the signal level of the ramp signal Vr2 is less than that of the analog signal $VA_{I,J}$, the comparator CP2 may output the comparison signal Vo1 having a signal level corresponding to a logic low level. Accordingly, the AND gate AG produces the control signal VC having a signal level, corresponding to the logic low level in the present embodiment, to turn off the switch circuit 328.

At time t1, as the signal level of the ramp signal Vr2 reaches or exceeds that of the analog signal $VA_{I,J}$, the comparator CP2 may output the comparison signal Vo1 having another signal level corresponding to a logic high level. In addition, as the signal level of the ramp signal Vr1 is still less than that of the analog signal $VA_{I,J}$, the comparator CP1 may output the comparison signal Vo1 having a signal level corresponding to the logic low level. As a result, a signal level of the comparison signal Vo3 corresponds to the logic high level. The AND gate AG produces the control signal VC having another signal level, corresponding to the logic high level in the present embodiment, according to the comparison signal Vo1 and the comparison signal Vo3, thereby turning on the switch circuit 328 to allow the storage circuit 326 to start receiving/storing the count value CT. It is worth noting that the storage circuit 326 starts to store the count value CT when the signal level of the ramp signal Vr2 exceeds the signal level of the analog signal $VA_{I,J}$, rather than when the counter 332 starts counting.

At time t2, as the signal level of the ramp signal Vr1 reaches or exceeds that of the analog signal $VA_{I,J}$, the comparator CP1 may output the comparison signal Vo1 having another signal level corresponding to the logic high level, causing the control signal VC to change to the logic low level. As a result, the switch circuit 328 is turned off. The ADC 320 can obtain the conversion result of the analog signal $VA_{I,J}$, which is the latest digital signal VD stored in the storage circuit 326 or the latest count value CT received from the counter circuit 330.

At time t3, another read out operation of the pixel $P_{I,J}$ may start such that the counter 332 may be enabled again. However, as shown in FIG. 4, the switch circuit 328 is turned off until time t4, at which the signal level of the ramp signal Vr2 reaches or exceeds that of the analog signal $VA_{I,J}$. In addition, the switch circuit 328 is turned on until time t5, at which the signal level of the ramp signal Vr1 reaches or exceeds that of the analog signal $VA_{I,J}$. As a result, a period of time TA during which the storage circuit 326 stores the count value CT is a relatively small portion of a period of time TB between the start of the readout operation and the end of the signal conversion, which greatly reduce power consumption resulting from data transmission between the processing circuit 334 and the counter circuit 330.

FIG. 3 and FIG. 4 also illustrate a control signal VC0 and a control signal VC1 for comparison. The control signal VC0 corresponds to some embodiments where the switch circuit 328 is turned on once the counting operation of the counter circuit 330 starts. In these embodiments, the storage circuit 326 would continue performing storage operation, which consumes large amounts of power. The control signal VC1 corresponds to some embodiments where the switch circuit 328 is turned on according to a delayed pulse generated when the signal level of the ramp signal Vr1 reaches or exceeds that of the analog signal $VA_{I,J}$. Please note that using the delayed pulse may fail to obtain the signal information corresponding to a time point when the signal level of the ramp signal Vr1 reaches that of the analog signal $VA_{I,J}$. For example, a noise response obtained using the control signal VC1 is not the real noise response at the time point when the signal level of the ramp signal Vr1 reaches that of the analog signal $VA_{I,J}$. Also, the delay time of the delay pulse may be affected by power noise.

In contrast, with the use of a comparison result of an analog signal level and different ramp signal levels, the ADC 320 can predict/determine if the signal level of the ramp signal Vr1 is about to reach that of the analog signal $VA_{I,J}$, thereby reducing a period of time that the storage circuit 326 is connected to the counter circuit 330. As a result, power consumption resulting from data transmission between the processing circuit 324 and the counter circuit 330 can be greatly reduced. Also, since the time point when the signal level of the ramp signal Vr1 reaches that of the analog signal $VA_{I,J}$ is predictable, the ADC 320 can obtain noise response which is closed to the real noise response.

It is worth noting that the circuit structure shown in FIG. 3 is provided for illustrative purposes, and is not intended to limit the scope of the present disclosure. In some embodiments, the comparators CP1 and CP2 can be implemented by a single comparator having two outputs. In some embodiments, the comparator CP2 can be integrated into the comparator CP1.

Figure 5:
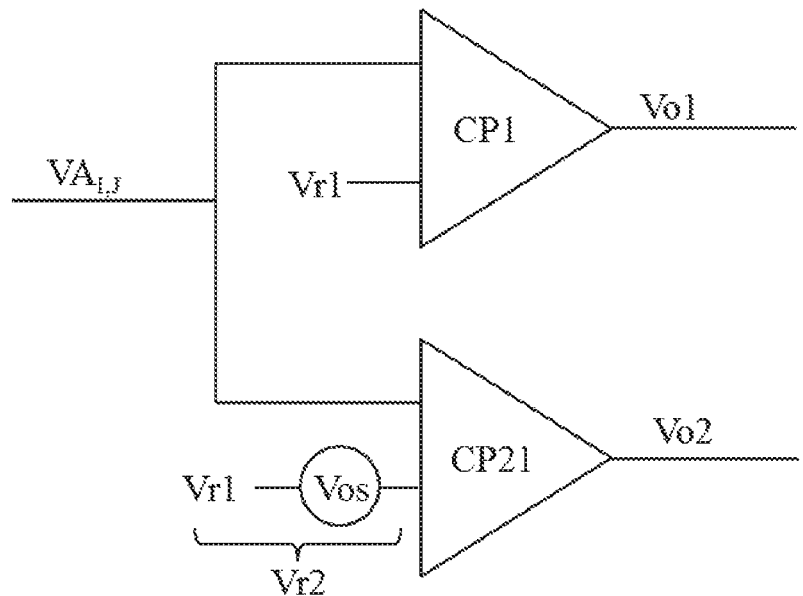
FIG. 5 illustrates an implementation of at least a portion of the comparison circuit shown in FIG. 2 is illustrated in accordance with some embodiments of the present disclosure.

In some embodiments, the ramp signal Vr2 may be provided according the ramp signal Vr1. Referring to FIG. 5, an implementation of at least a portion of the comparison circuit 222 shown in FIG. 2 is illustrated in accordance with some embodiments of the present disclosure. The comparator circuit structure shown in FIG. 5 is similar to that shown in FIG. 3 except that the comparator CP21 shown in FIG. 5 is configured to compare the analog signal $VA_{I,J}$ with the ramp signal Vr1 plus the predetermined offset Vos, which is provided by a signal source (not shown in FIG. 5) external to the comparator CP21. The signal level of the ramp signal Vr1 plus the predetermined offset Vos is equal to the signal level of the ramp signal Vr2 shown in FIG. 3. As a result, the comparator CP21 can be configured to compare the analog signal $VA_{I,J}$ with the ramp signal Vr2 by comparing the analog signal $VA_{I,J}$ with the ramp signal Vr1 plus the predetermined offset Vos. In the present embodiment, the comparator CP1 can be coupled to a ramp generator configured to provide the ramp signal Vr1, and the comparator CP2 can be coupled to the ramp generator and the signal source configured to provide the predetermined offset Vos.

Figure 6:
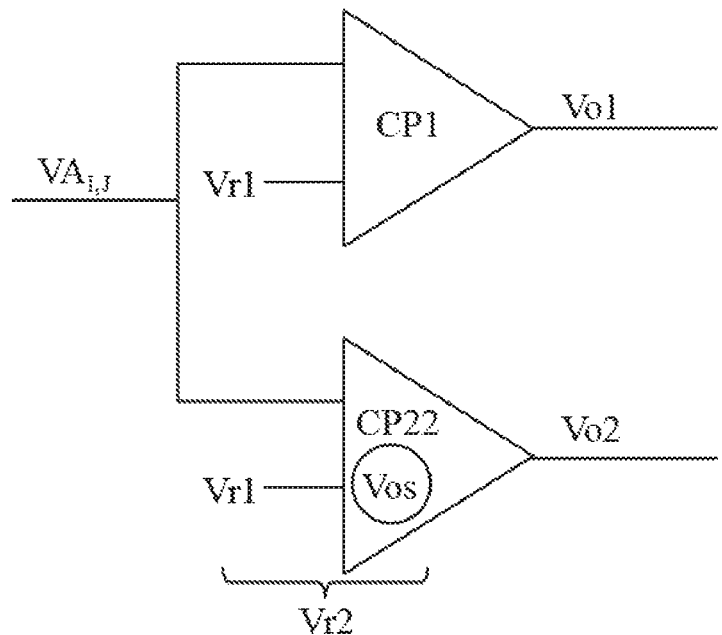
FIG. 6 illustrates another implementation of at least a portion of the comparison circuit shown in FIG. 2 in accordance with some embodiments of the present disclosure.

FIG. 6 illustrates another implementation of at least a portion of the comparison circuit 222 shown in FIG. 2 in accordance with some embodiments of the present disclosure. The comparator circuit structure shown in FIG. 6 is similar to that shown in FIG. 3 except that the comparator CP22 shown in FIG. 6 is configured to compare the analog signal $VA_{I,J}$ with the ramp signal Vr1 plus the predetermined offset Vos, which is an inherent comparator offset of the comparator CP22. The signal level of the ramp signal Vr1 plus the predetermined offset Vos is equal to the signal level of the ramp signal Vr2 shown in FIG. 3. As a result, the comparator CP22 can be configured to compare the analog signal $VA_{I,J}$ with the ramp signal Vr2 by comparing the analog signal $VA_{I,J}$ with the ramp signal Vr1 plus the predetermined offset Vos. In the present embodiment, each of the comparators CP1 and CP2 can be coupled to a same ramp generator configured to provide the ramp signal Vr1.

Figure 7:
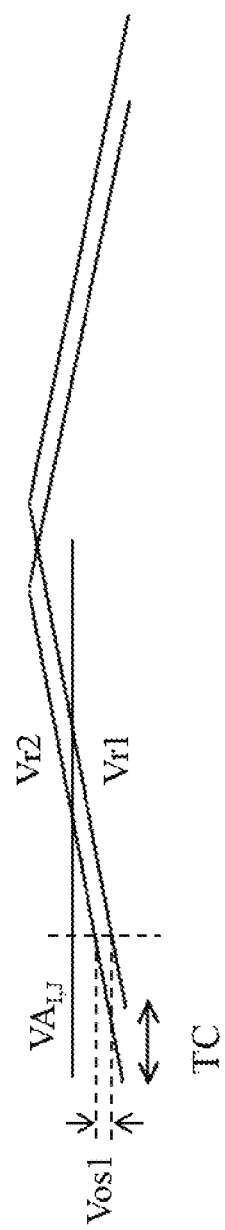
FIG. 7 illustrates an implementation of the ramp signals shown in FIG. 2 in accordance with some embodiments of the present disclosure.

FIG. 7 illustrates an implementation of the ramp signals Vr1 and Vr2 shown in FIG. 2 in accordance with some embodiments of the present disclosure. Referring to FIG. 7 and also to FIG. 2, the comparison circuit 222 is configured to receive the ramp signal Vr2, or an advanced replica of the ramp signal Vr1, at a time earlier than a time when the comparison circuit 222 receives the ramp signal Vr1 by a predetermined period of time TC. As a result, the signal level of the ramp signal Vr2 has a predetermined offset Vos1 relative to the signal level of the ramp signal Vr1. By comparing the analog signal $VA_{I,J}$ with the advanced replica of the ramp signal Vr1, the comparison circuit 222 can compare the analog signal $VA_{I,J}$ with the ramp signal Vr1 plus the predetermined offset Vos1.

It is worth noting that a time period TD during which the signal level of the analog signal $VA_{I,J}$ lies between the signal level of the ramp signal Vr2 and the signal level of the ramp signal Vr1 equals to the predetermined period of time TC. The comparison circuit 222 can enable storage of the count value CT according to the predetermined period of time TC.

In some embodiments, the predetermined offset Vos1, or a difference between the respective signal levels of the ramp signals Vr2 and Vr1, can be determined according to the predetermined period of time TC. For example, when the predetermined of time TC is equal to the predetermined of time TA shown in FIG. 4, the predetermined offset Vos1 is equal to the predetermined offset Vos shown in FIG. 4.

In some embodiments, a period of time during which storage of a count value is enabled can be determined according to the predetermined period of time TC. For example, the processing circuit 334 shown in FIG. 3 can enable the storage of the count value CT The above is for illustrative purposes, and is not intended to limit the scope of the present disclosure. As long as a comparison circuit can compare an analog signal and a ramp signal to determine predict/determine if a count value or a resulting digital signal corresponding to the analog signal is about to be obtained/transmitted, associated modifications and alternatives fall within the scope of the present disclosure.

Figure 8:
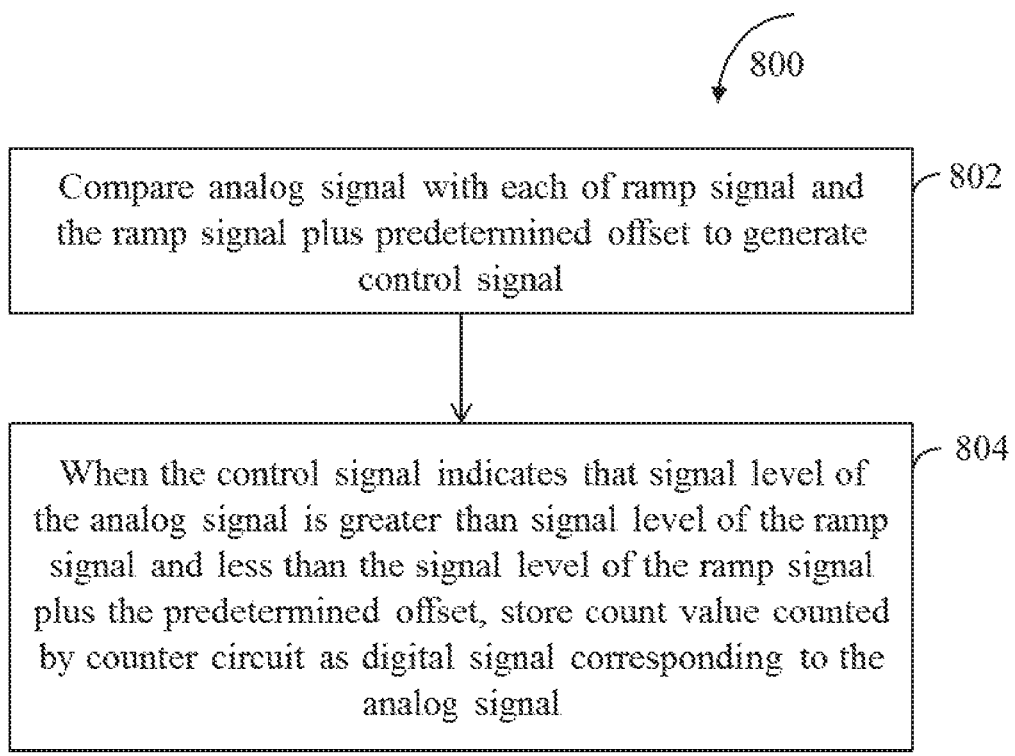
FIG. 8 is a flowchart of an exemplary analog-to-digital conversion method in accordance with some embodiments of the present disclosure.

FIG. 8 is a flowchart of an exemplary analog-to-digital conversion method in accordance with some embodiments of the present disclosure. For illustrative purposes, the analog-to-digital conversion method 800 is described with reference to the ADC 220 shown in FIG. 2. Those skilled in the art will recognize that the analog-to-digital conversion method 800 can be employed in each ADC of the analog-to-digital conversion circuit 120 shown in FIG. 1 and/or the ADC 320 shown in FIG. 3 without departing from the scope of the present disclosure. Additionally, in some embodiments, other operations in the analog-to-digital conversion method 800 can be performed. In some embodiments, operations of the analog-to-digital conversion method 800 can be performed in a different order and/or vary.

At operation 802, an analog signal is compared with each of a ramp signal and the ramp signal plus a predetermined offset to generate a control signal. For example, the comparison circuit 222 is configured to compare the analog signal $VA_{I,J}$ outputted from the pixel $P_{I,J}$ with each of the ramp signal Vr1 and the ramp signal Vr1 plus a predetermined offset to generate the control signal VC, wherein the ramp signal Vr1 plus the predetermined offset can be implemented by the ramp signal Vr2.

At operation 804, when the control signal indicates that a signal level of the analog signal is greater than a signal level of the ramp signal and less than the signal level of the ramp signal plus the predetermined offset, a count value counted by a counter circuit is stored as a digital signal corresponding to the analog signal. For example, when the control signal VC indicates that the signal level of the analog signal $VA_{I,J}$ lies between the respective signal levels of the ramp signal Vr1 and Vr2, the processing circuit 224 is configured to store the count value CT as the digital signal VD.

In some embodiments, when the control signal indicates that the signal level of the analog signal is less than the signal level of the ramp signal, storing the count value counted by the counter circuit is stopped. For example, when the control signal VC indicates that the signal level of the analog signal $VA_{I,J}$ is less than the signal level of the ramp signal Vr1, the processing circuit 224 may stop store the count value CT. The latest digital signal VD stored in the processing circuit 224, or the latest count value CT received from the counter circuit 130, can be used as the conversion result of the analog signal $VA_{I,J}$.

In some embodiments, when the control signal indicates that the signal level of the analog signal is greater than the signal level of the ramp signal plus the predetermined offset, storage of the count value counted by the counter circuit is disabled. For example, when the control signal VC indicates that the signal level of the analog signal $VA_{I,J}$ is greater than the signal level of the ramp signal Vr2, the processing circuit 224 does not enable the storage of the count value CT, thus reducing power consumption resulting from data storage.

As those skilled in the art should understand each operation of the analog-to-digital conversion method 800 after reading the above paragraphs directed to FIG. 1 through FIG. 7, further description is omitted for the sake of brevity.

With the use of a comparison result of an analog signal level and different ramp signal levels, the proposed analog-to-digital conversion scheme can selectively enable storage of a count value provided by a counter circuit, thereby reducing power consumption resulting from data transmission between an ADC and the counter circuit. For example, power consumption of the proposed ADC can be reduced to a small fraction, such as 10%, of that of an existing pixel ADC, depending on at least one of the analog level and a predetermined offset associated with the different ramp signal levels. Also, as a time point when a ramp signal level reaches the analog signal level is predictable, the proposed analog-to-digital conversion scheme can obtain noise response which is closed to the real noise response.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter for converting an analog signal to a digital signal, the analog-to-digital conversion circuit comprising:

a comparison circuit, configured to compare the analog signal with each of a ramp signal and the ramp signal plus a predetermined offset to generate a control signal; and a processing circuit, coupled to the comparison circuit, the processing circuit being configured to selectively store a count value of a counter circuit as the digital signal according to the control signal, wherein when the control signal indicates that a signal level of the analog signal is greater than a signal level of the ramp signal and less than the signal level of the ramp signal plus the predetermined offset, the processing circuit is configured to store the count value as the digital signal.

2. The analog-to-digital converter of claim 1, wherein when the control signal indicates that the signal level of the analog signal is less than the signal level of the ramp signal, the processing circuit does not store the count value.

3. The analog-to-digital converter of claim 1, when the control signal indicates that the signal level of the analog signal is greater than the signal level of the ramp signal plus the predetermined offset, the processing circuit does not store the count value.

4. The analog-to-digital converter of claim 1, wherein the comparison circuit comprises:

a first comparator, configured to compare the analog signal with the ramp signal to generate a first comparison signal;

a second comparator, configured to compare the analog signal with the ramp signal plus the predetermined offset to generate a second comparison signal; and a signal generation circuit, coupled to the first comparator and the second comparator, the signal generation circuit being configured to generate the control signal according to the first comparison signal and the second comparison signal.

5. The analog-to-digital converter of claim 4, wherein when the first comparison signal indicates that the signal level of the analog signal is less than the signal level of the ramp signal, or the second comparison signal indicates that the signal level of the analog signal is greater than the signal level of the ramp signal plus the predetermined offset, the signal generation circuit is configured to generate the control signal having a first signal level; when the first comparison signal indicates that the signal level of the analog signal is greater than the signal level of the ramp signal, and the second comparison signal indicates that the signal level of the analog signal is less than the signal level of the ramp signal plus the predetermined offset, the signal generation circuit is configured to generate the control signal having a second signal level different from the first signal level.

6. The analog-to-digital converter of claim 4, wherein the signal generation circuit comprises:

an inverter, coupled to the first comparator, the inverter being configured to invert the first comparison signal to generate a third comparison signal; and an AND gate, coupled to the second comparator and the inverter, the AND gate being configured to receive the second comparison signal and the third comparison signal to generate the control signal.

7. The analog-to-digital converter of claim 1, wherein the predetermined offset is an inherent comparator offset of the comparison circuit.

8. The analog-to-digital converter of claim 1, wherein the comparison circuit is configured to receive an advanced replica of the ramp signal, and compare the analog signal with the ramp signal plus the predetermined offset by comparing the analog signal with the advanced replica of the ramp signal.

9. The analog-to-digital converter of claim 1, wherein the processing circuit comprises:
   a storage circuit, configured to store the count value as the digital signal; and
   a switch circuit, configured to provide the count value of the counter circuit to the storage circuit according to the control signal.

10. An image sensor, comprising:
   a pixel array, having a plurality of pixels;
   a counter circuit, configured to provide a count value according to a clock signal; and
   an analog-to-digital conversion circuit, coupled to the pixel array and the counter circuit, the analog-to-digital conversion circuit comprising at least one analog-to-digital converter, the analog-to-digital converter being configured to convert an analog signal outputted from a pixel to a digital signal according to the count value, the analog-to-digital converter comprising:
      a comparison circuit, configured to compare the analog signal with each of a ramp signal and the ramp signal plus a predetermined offset to generate a control signal; and
      a processing circuit, coupled to the comparison circuit, the processing circuit being configured to selectively store the count value of the counter circuit as the digital signal according to the control signal, wherein when the control signal indicates that a signal level of the analog signal is greater than a signal level of the ramp signal and less than the signal level of the ramp signal plus the predetermined offset, the processing circuit is configured to store the count value as the digital signal.

11. The image sensor of claim 10, wherein the pixel array is disposed on a first circuit layer, and the analog-to-digital conversion circuit is disposed on a second circuit layer; the first circuit layer and the second circuit layer are disposed one over the other.

12. The image sensor of claim 10, wherein a plurality of analog-to-digital converters of the analog-to-digital conversion circuit are coupled to a plurality of pixels arranged in a predetermined direction in the pixel array, respectively; each of the analog-to-digital converters is configured to convert an analog signal of an associated pixel according to the count value.

13. The image sensor of claim 12, wherein the predetermined direction is a row direction or a column direction.

14. The image sensor of claim 10, wherein when a readout operation of the pixel starts, the counter circuit is configured to start counting a number of clock cycles of the clock signal to generate the count value.

15. An analog-to-digital conversion method, comprising:
   comparing an analog signal with each of a ramp signal and the ramp signal plus a predetermined offset to generate a control signal; and
   when the control signal indicates that a signal level of the analog signal is greater than a signal level of the ramp signal and less than the signal level of the ramp signal plus the predetermined offset, storing a count value counted by a counter circuit as a digital signal corresponding to the analog signal.

16. The analog-to-digital conversion method of claim 15, further comprising:
   when the control signal indicates that the signal level of the analog signal is less than the signal level of the ramp signal, stopping storing the count value counted by the counter circuit.

17. The analog-to-digital conversion method of claim 15, further comprising:
   when the control signal indicates that the signal level of the analog signal is greater than the signal level of the ramp signal plus the predetermined offset, disabling storage of the count value counted by the counter circuit.

18. The analog-to-digital conversion method of claim 15, wherein the step of comparing the analog signal with each of the ramp signal and the ramp signal plus the predetermined offset to generate the control signal comprises:
   comparing the analog signal with the ramp signal plus the predetermined offset to generate a first comparison signal;
   comparing the analog signal with the ramp signal to generate a second comparison signal;
   when the first comparison signal indicates that the signal level of the analog signal is less than the signal level of the ramp signal plus the predetermined offset, and the second comparison signal indicates that the signal level of the analog signal is greater than the signal level of the ramp signal, generating the control signal having a first signal level; and
   when the first comparison signal indicates that the signal level of the analog signal is greater than the signal level of the ramp signal plus the predetermined offset, or the second comparison signal indicates that the signal level of the analog signal is less than the signal level of the ramp signal, generating the control signal having a second signal level different from the first signal level.

19. The analog-to-digital conversion method of claim 15, wherein the step of comparing the analog signal with the ramp signal plus the predetermined offset comprises:
   comparing the analog signal with an advanced replica of the ramp signal, wherein a signal level of the advanced replica of the ramp signal is the predetermined offset greater than the signal level of the ramp signal.

20. The analog-to-digital conversion method of claim 15, wherein the analog signal is outputted from a pixel in response to a readout operation of the pixel; the analog-to-digital conversion method further comprises:
   when the readout operation starts, utilizing the counter circuit to count a number of clock cycles of a clock signal to generate the count value.

* * * * *